US012763777B2

(12) United States Patent
Lu et al.

(10) Patent No.: US 12,763,777 B2
(45) Date of Patent: Oct. 13, 2026

(54) AUDIO RESTORE CIRCUIT

(71) Applicant: Realtek Semiconductor Corporation, Hsinchu (TW)

(72) Inventors: Chien-Hsun Lu, Hsinchu (TW); Yi-Han Peng, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 392 days.

(21) Appl. No.: 18/424,856

(22) Filed: Jan. 28, 2024

(65) Prior Publication Data

US 2024/0275389 A1 Aug. 15, 2024

(30) Foreign Application Priority Data

Feb. 15, 2023 (TW) ................................ 112105419

(51) Int. Cl.
*H03L 7/081* (2006.01)
*H04R 5/04* (2006.01)

(52) U.S. Cl.
CPC ............. *H03L 7/0814* (2013.01); *H04R 5/04* (2013.01)

(58) Field of Classification Search
CPC ................................ H04R 5/04; H03L 7/0814
See application file for complete search history.

(56) References Cited

U.S. PATENT DOCUMENTS 7,760,766 B2 * 7/2010 Takahashi ................ H04S 7/00 375/376
8,258,846 B2 * 9/2012 Lin ........................ H04L 7/005 327/299
11,764,890 B2 * 9/2023 Williams ................ H04L 65/60 370/509
12,609,130 B2 * 4/2026 Zhang ................. G10L 21/0324
2011/0087347 A1 4/2011 Hammond et al.
2019/0297589 A1 * 9/2019 Boehlke ................. H04R 27/00
2019/0306625 A1 * 10/2019 Filippini .................. H04R 3/12

FOREIGN PATENT DOCUMENTS

CN 114640344 A 6/2022
CN 115696141 A 2/2023

OTHER PUBLICATIONS

High-Definition Multimedia Interface Specification Version 2.1, HDMI Forum, pp. 293-309, Nov. 13, 2017.
IEC 60958-1, International Standard, Second edition, pp. 1-18, Mar. 2004.
IEC 61937-13, International Standard, First edition, pp. 1-17, Apr. 2018.

* cited by examiner

*Primary Examiner* — Paul W Huber
(74) *Attorney, Agent, or Firm* — CKC & Partners Co., LLC

(57) ABSTRACT

An audio restore circuit includes an audio tracking circuit, a clock adjustment circuit, and an audio generator circuit. The audio tracking circuit is configured to generate a first control signal according to a sampling rate of an audio sampled signal and a clock rate of an audio clock signal. The clock adjustment circuit is configured to adjust the clock rate of the audio clock signal according to the first control signal. The audio generator circuit is configured to output a plurality of audio output signals according to the audio sampled signal and the audio clock signal.

18 Claims, 3 Drawing Sheets

AUDIO RESTORE CIRCUIT

RELATED APPLICATIONS

This application claims priority to Taiwanese Application Serial Number 112105419, filed Feb. 15, 2023, which is herein incorporated by reference.

BACKGROUND

Technical Field

The present disclosure relates to technology about adjustments for clock signals. More particularly, the present disclosure relates to an audio restore circuit capable of adjusting clock rates.

Description of Related Art

In technologies related to audio signals, an audio restore circuit can utilize an audio clock signal to restore a single-channel integrated audio signal (integrated from multi-channel audio signals) back to the multi-channel audio signals. However, since the audio signals are continuous, a rate of the audio clock signal is a key factor of whether the audio signals can be restored correctly.

SUMMARY

Some aspects of the present disclosure are to provide an audio restore circuit. The audio restore circuit includes an audio tracking circuit, a clock adjustment circuit, and an audio generator circuit. The audio tracking circuit is configured to generate a first control signal according to a sampling rate of an audio sampled signal and a clock rate of an audio clock signal. The clock adjustment circuit is configured to adjust the clock rate of the audio clock signal according to the first control signal. The audio generator circuit is configured to output a plurality of audio output signals according to the audio sampled signal and the audio clock signal.

Some aspects of the present disclosure are to provide an audio restore circuit. The audio restore circuit includes an audio generator circuit, a clock adjustment circuit, and an audio tracking circuit. The audio generator circuit includes a storage circuit. The audio tracking circuit is configured to generate a control signal according to a data amount of an audio sampled signal, a data water level upper limit, and a data water level lower limit. The clock adjustment circuit is configured to adjust a clock rate of an audio clock signal according to the control signal. The audio generator circuit is configured to output a plurality of audio output signals according to the audio sampled signal and the audio clock signal. The storage circuit is configured to receive and store the audio sampled signal.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
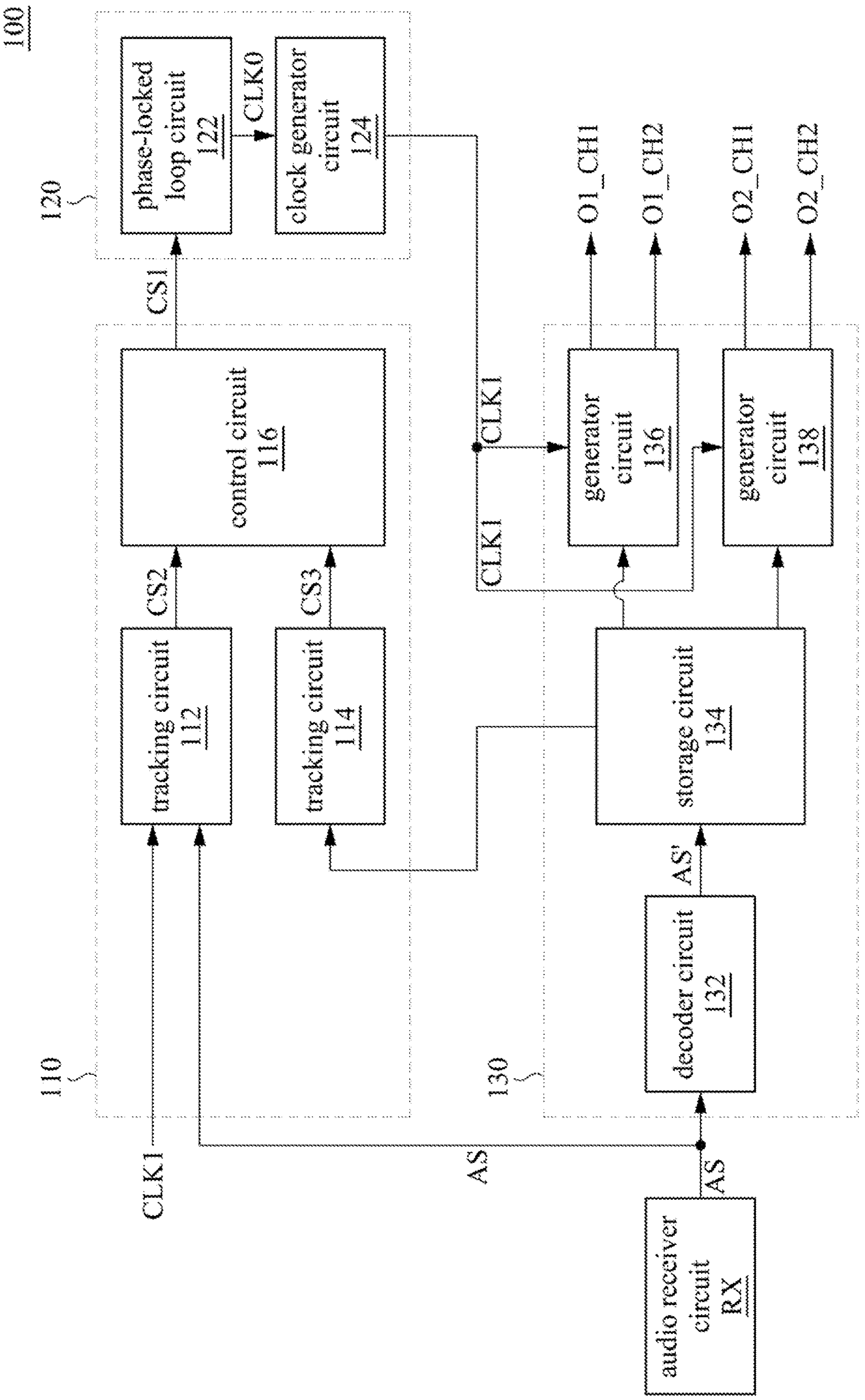
FIG. 1 is a schematic diagram of an audio restore circuit according to some embodiments of the present disclosure.

Reference is made to FIG. 1. FIG. 1 is a schematic diagram of an audio restore circuit 100 according to some embodiments of the present disclosure.

The audio restore circuit 100 can receive an audio sampled signal AS from an audio receiver circuit RX, and generate (restore) a plurality of audio output signals O1CH1-O1CH2 or a plurality of audio output signals O2CH1-O2CH2 according to the audio sampled signal AS.

The audio receiver circuit RX is, for example, an Audio Return Channel (ARC) receiver or an Enhanced ARC (eARC) receiver.

The audio output signals O1CH1-O1CH2 can be, for example, two-channel signals with Inter-IC Sound (I2S) standard. The audio output signals O2CH1-O2CH2 can be, for example, two-channel signals with Sony/Philips Digital Interface Format (S/PDIF) standard. However, the present disclosure is not limited to the above standards and the channel number above. Various suitable standards and channel numbers are within the contemplated scopes of the present disclosure.

As illustrated in FIG. 1, the audio restore circuit 100 includes an audio tracking circuit 110, a clock adjustment circuit 120, and an audio generator circuit 130.

The audio receiver circuit RX is coupled to the audio tracking circuit 110 and the audio generator circuit 130. The clock adjustment circuit 120 is coupled to the audio tracking circuit 110 and the audio generator circuit 130.

As illustrated in FIG. 1, the audio tracking circuit 110 includes a tracking circuit 112, a tracking circuit 114, and a control circuit 116.

The tracking circuit 112 can generate a control signal CS2 according to a sampling rate of the audio sampled signal AS and a clock rate of an audio clock signal CLK1. The control circuit 116 can generate a control signal CS1 according to the control signal CS2. The clock adjustment circuit 120 can adjust the clock rate of the audio clock signal CLK1 according to the control signal CS1.

Figure 2:
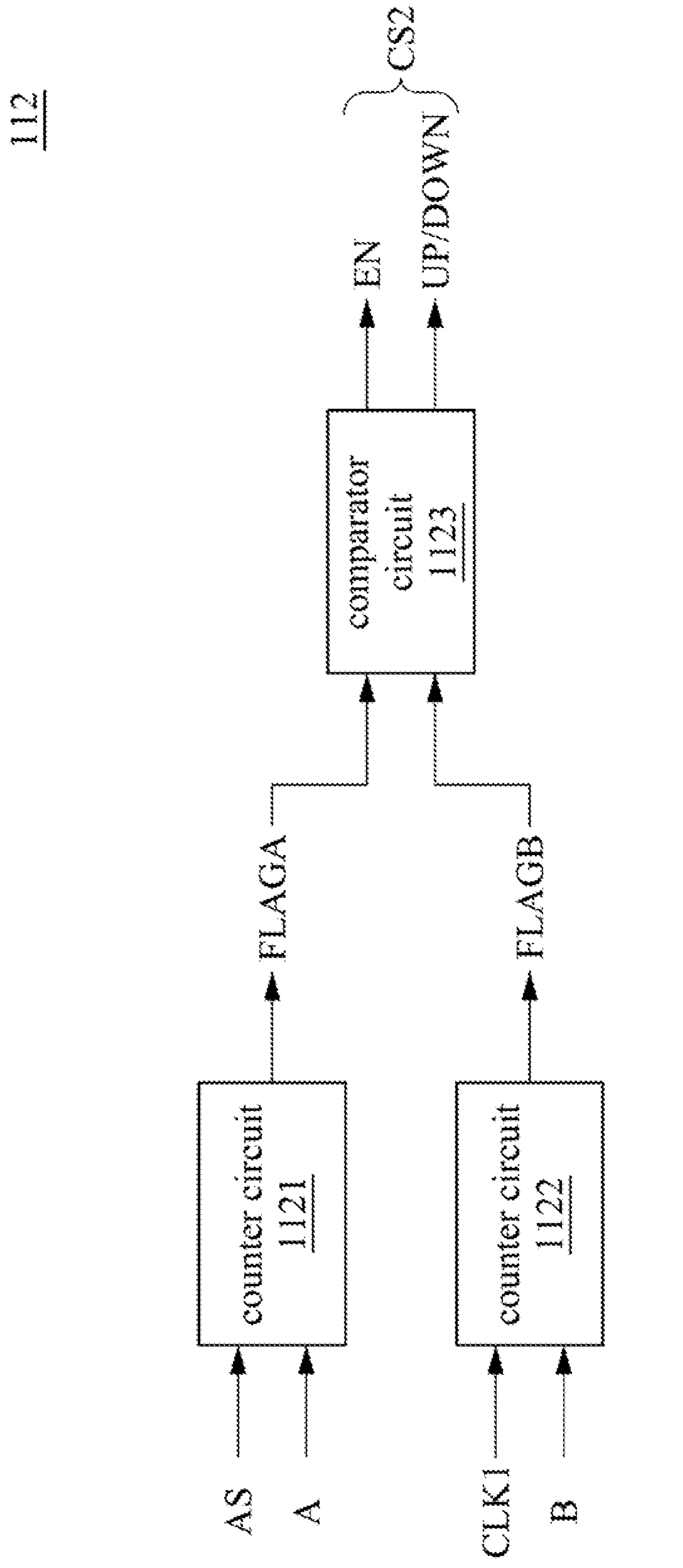
FIG. 2 is a schematic diagram of operations of a tracking circuit according to some embodiments of the present disclosure.

Reference is made to FIG. 2. FIG. 2 is a schematic diagram of operations of the tracking circuit 112 according to some embodiments of the present disclosure.

As illustrated in FIG. 2, the tracking circuit 112 includes a counter circuit 1121, a counter circuit 1122, and a comparator circuit 1123.

The counter circuit 1121 counts the sampling rate of the audio sampled signal AS. When the counting value is equal to a counting threshold value A, a flag signal FLAGA is flagged (generated). Similarly, the counter circuit 1122 counts the clock rate of the audio clock signal CLK1. When the counting value is equal to a counting threshold value B, a flag signal FLAGB is flagged (generated).

In some embodiments, the counting threshold value A and the counting threshold value B satisfy formula (1) below:

$$A = \frac{C}{2} \times B \tag{1}$$

wherein C is a channel number corresponding to the audio output signals O1CH1-O1CH2 or the audio output signals O2CH1-O2CH2. In this example, the channel number is 2. According to the formula (1) above, when the channel number is 2, the counting threshold value A is set to be equal to the counting threshold value B. When the channel number is greater than 2 (e.g., 4, or 8), the counting threshold value A is set to be greater than the counting threshold value B. In some embodiments, a setting circuit can set the counting threshold value A and the counting threshold value B in advance according to the formula (1) above. When the counting threshold value A and the counting threshold value B are greater, it means that a time interval for adjusting the clock rate is longer (less frequent). When the counting threshold value A and the counting threshold value B are less, it means that the time interval for adjusting the clock rate is shorter (more frequent).

When a flagging time point of the flag signal FLAGA is identical to a flagging time point of the flag signal FLAGB, it means that the clock rate of the audio clock signal CLK1 does not need to be adjusted. The comparator circuit 1123 outputs an enable signal EN with a first logic value (e.g., a logic value 0) to not adjust (to maintain) the clock rate of the audio clock signal CLK1.

When the flagging time point of the flag signal FLAGA is non-identical to the flagging time point of the flag signal FLAGB, it means that the clock rate of the audio clock signal CLK1 needs to be adjusted. The comparator circuit 1123 outputs the enable signal EN with a second logic value (e.g., a logic value 1) to adjust the clock rate of the audio clock signal CLK1. To be more specific, when the flagging time point of the flag signal FLAGA is earlier than the flagging time point of the flag signal FLAGB, the comparator circuit 1123 outputs (generates) a speed-up signal UP. The control circuit 116 generates the control signal CS1 according to the control signal CS2 (including the enable signal EN with the second logic value and the speed-up signal UP). The clock adjustment circuit 120 speeds up the clock rate of the audio clock signal CLK1 according to the control signal CS1. When the flagging time point of the flag signal FLAGA is later than the flagging time point of the flag signal FLAGB, the comparator circuit 1123 outputs (generates) a slow-down signal DOWN. The control circuit 116 generates the control signal CS1 according to the control signal CS2 (including the enable signal EN with the second logic value and the slow-down signal DOWN). The clock adjustment circuit 120 slows down the clock rate of the audio clock signal CLK1 according to the control signal CS1.

The aforementioned tracking circuit 112 can be implemented by any combination of one or more hardware circuits (e.g., special integrated application circuits), software, or firmware.

As illustrated in FIG. 1, the clock adjustment circuit 120 includes a phase-locked loop circuit 122 and a clock generator circuit 124. The phase-locked loop circuit 122 can generate a phase-locked loop clock signal CLK0 according to the control signal CS1. The clock generator circuit 124 can generates the audio clock signal CLK1 according to the phase-locked loop clock signal CLK0. Since the control signal CS1 is generated according to the control signal CS2 and the control signal CS2 is generated in response to the speed-up signal UP or the slow-down signal DOWN, the phase-locked loop circuit 122 can generate the phase-locked loop clock signal CLK0 with a faster rate or a slower rate according to the control signal CS1 such that the clock generator circuit 124 generates the audio clock signal CLK1 with a faster rate or a slower rate.

After the clock adjustment circuit 120 adjusts the clock rate of the audio clock signal CLK1, the audio generator circuit 130 can generate the audio output signals O1CH1-O1CH2 or the audio output signals O2CH1-O2CH2 according to the audio sampled signal AS and the audio clock signal CLK1.

As illustrated in FIG. 1, the audio generator circuit 130 includes a decoder circuit 132, a storage circuit 134, a generator circuit 136, and a generator circuit 138.

In some embodiments, the storage circuit 134 includes a First-In First-Out (FIFO) storage (e.g., register). For example, the storage circuit 134 is implemented by the FIFO storage. Compared to other storages (e.g., SRAM), the FIFO storage (e.g., register) has a smaller storage and is less expensive.

The decoder circuit 132 receives the audio sampled signal AS and generates a decoded audio sampled signal AS'. The storage circuit 134 stores the decoded audio sampled signal AS'. The tracking circuit 114 generates a control signal CS3 according to data amount in the storage circuit 134, a data water level upper limit (K-N), and a data water level lower limit M, in which K is a maximum water level, and N is a difference between the maximum water level of the storage circuit 134 and the water level upper limit of the storage circuit 134. In some embodiments, K is 256-level, but the present disclosure is not limited thereto. The control circuit 116 can generate the control signal CS1 according to the control signal CS3. The clock adjustment circuit 120 can adjust the clock rate of the audio clock signal CLK1 according to the control signal CS1.

Figure 3:
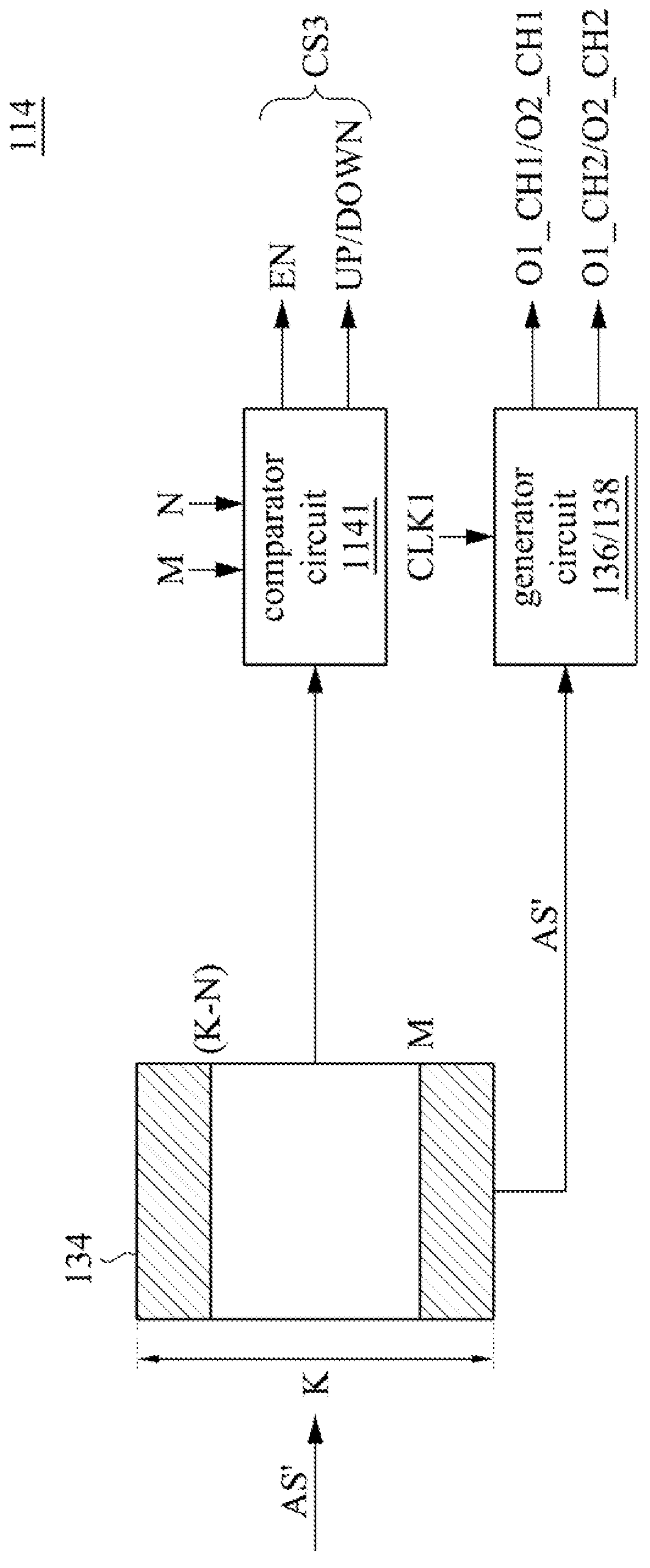
FIG. 3 is a schematic diagram of operations of a tracking circuit according to some embodiments of the present disclosure.

Reference is made to FIG. 3. FIG. 3 is a schematic diagram of operations of the tracking circuit 114 according to some embodiments of the present disclosure.

As illustrated in FIG. 3, the tracking circuit 114 includes a comparator circuit 1141. The storage circuit 134 receives and stores the decoded audio sampled signal AS'. When the data amount in the storage circuit 134 is between the data water level upper limit (K-N) and the data water level lower limit M (less than or equal to the data water level upper limit (K-N) and greater than or equal to the data water level lower limit M), it means that the clock rate of the audio clock signal CLK1 does not need to be adjusted. The comparator circuit 1141 outputs the enable signal EN with the first logic value (e.g., the logic value 0) to not adjust (to maintain) the clock rate of the audio clock signal CLK1.

When the data amount in the storage circuit 134 is greater than the data water level upper limit (K-N) or less than the data water level lower limit M, it means that the clock rate of the audio clock signal CLK1 needs to be adjusted. The comparator circuit 1141 outputs the enable signal EN with the second logic value (e.g., the logic value 1) to adjust the clock rate of the audio clock signal CLK1. To be more specific, when the data amount in the storage circuit 134 is greater than the data water level upper limit (K-N), the comparator circuit 1141 outputs (generates) the speed-up signal UP. The control circuit 116 generates the control signal CS1 according to the control signal CS3 (including the enable signal EN with the second logic value and the speed-up signal UP). The clock adjustment circuit 120 speeds up the clock rate of the audio clock signal CLK1 according to the control signal CS1. When the data amount in the storage circuit 134 is less than the data water level lower limit M, the comparator circuit 1141 outputs (generates) the slow-down signal DOWN. The control circuit 116 generates the control signal CS1 according to the control signal CS3 (including the enable signal EN with the second logic value and the slow-down signal DOWN). The clock adjustment circuit 120 slows down the clock rate of the audio clock signal CLK1 according to the control signal CS1.

The tracking circuit 114 above can be can be implemented by any combination of one or more hardware circuits (e.g., special integrated application circuits), software, or firmware.

Since the control signal CS1 is generated according to the control signal CS3 and the control signal CS3 is generated in response to the speed-up signal UP or the slow-down signal DOWN, the phase-locked loop circuit 122 can generate the phase-locked loop clock signal CLK0 with a faster rate or a slower rate according to the control signal CS1 such that the clock generator circuit 124 generates the audio clock signal CLK1 with a faster rate or a slower rate.

After the clock adjustment circuit 120 adjusts the clock rate of the audio clock signal CLK1, the generator circuit 136 or the generator circuit 138 can generate the audio output signals O1CH1-O1CH2 or the audio output signals O2CH1-O2CH2 according to the decoded audio sampled signal AS' in the storage circuit 134 and the audio clock signal CLK1.

In some related approaches, a high-speed central processor is used to detect data amount in a SRAM at different time points. When the data amount at a later time point is greater than the data amount at a previous time point, the high-speed central processor speeds up the audio clock signal. When the data amount at a later time point is less than the data amount at a previous time point, the high-speed central processor slows down the audio clock signal. However, these related approaches need the high-speed central processor and the SRAM with a larger storage capacity and a higher cost.

Compared to the aforementioned approaches, in the present disclosure, the tracking circuit 112 (comparing the flagging time point of the flag signal FLAGA and the flagging time point of the flag signal FLAGB) or the tracking circuit 114 (comparing the data amount of the storage circuit 134, the data water level upper limit (K-N), and the data water level lower limit M) can be utilized to adjust the clock rate of the audio clock signal CLK1. The present disclosure does not need the high-speed central processor and the SRAM. Thus, the present disclosure has advantages of power saving and low cost.

In some embodiments, only the tracking circuit 112 is turned on or only the tracking circuit 114 is turned on. In some embodiments, both of the tracking circuit 112 and the tracking circuit 114 are turned on. In the embodiments where both of the tracking circuit 112 and the tracking circuit 114 are turned on, the control signal CS2 generated by the tracking circuit 112 and the control signal CS3 generated by the tracking circuit 114 correspond to different weighting values respectively. For example, when a clock tracking effect of the tracking circuit 112 is better, the weighting value of the control signal CS2 can be set to be greater and the weighting value of the control signal CS3 can be set to be less. In other words, the control signal CS2 can make a more significant adjustment to the clock rate and the control signal CS3 makes a less adjustment to the clock rate. Then, the control circuit 116 can generate the control signal CS1 according to the control signal CS2-CS3 with the corresponding weighting values and can transmit the control signal CS1 to the clock adjustment circuit 120. Then, the clock adjustment circuit 120 adjusts the clock rate of the audio clock signal CLK1 according to the control signal CS1. In some embodiments, when a clock tracking effect of the tracking circuit 114 is better, the weighting value of the control signal CS2 can be set to be less and the weighting value of the control signal CS3 can be set to be greater. In some embodiments, the weighting value of the control signal CS2 can be set to be equal to the weighting value of the control signal CS3. In other words, the weighting values of the control signal CS2 and the control signal CS3 can be adjusted according to system requirements, performance targets, and cost for implementations, but the present disclosure is not limited thereto. The operation method about how the control circuit 116 generates the control signal CS1 according to the control signal CS2-CS3 with the corresponding weighting values can refer to the embodiments above, so they are not described herein again.

As described above, in the present disclosure, one or more tracking circuits are utilized to adjust the clock rate of the audio clock signal. The present disclosure does not need the high-speed central processor and the SRAM. Thus, the present disclosure has advantages of power saving and low cost.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An audio restore circuit, comprising:

an audio tracking circuit configured to generate a first control signal according to a sampling rate of an audio sampled signal and a clock rate of an audio clock signal;

a clock adjustment circuit configured to adjust the clock rate of the audio clock signal according to the first control signal; and an audio generator circuit configured to output a plurality of audio output signals according to the audio sampled signal and the audio clock signal, wherein the audio tracking circuit is further configured to generate a first flag signal according to the sampling rate of the audio sampled signal and a first counting threshold value, generate a second flag signal according to the clock rate of the audio clock signal and a second counting threshold value, generate a second control signal according to the first flag signal and the second flag signal, and generate the first control signal according to the second control signal.

2. The audio restore circuit of claim 1, wherein the first counting threshold value is greater than or equal to the second counting threshold value.

3. The audio restore circuit of claim 1, wherein the first counting threshold value and the second counting threshold value satisfy a formula below:

$$A = \frac{C}{2} \times B$$

wherein A is the first counting threshold value, B is the second counting threshold value, and C is a channel number corresponding to the plurality of audio output signals.

4. The audio restore circuit of claim 1, wherein the second control signal comprises an enable signal, wherein when a first flagging time point of the first flag signal is identical to a second flagging time point of the second flag signal, the audio tracking circuit generates the enable signal with a first logic value to maintain the clock rate of the audio clock signal, wherein when the first flagging time point is non-identical to the second flagging time point, the audio tracking circuit generates the enable signal with a second logic value to adjust the clock rate of the audio clock signal.

5. The audio restore circuit of claim 4, wherein the second control signal further comprises a speed-up signal and a slow-down signal, wherein when the first flagging time point is earlier than the second flagging time point, the audio tracking circuit generates the speed-up signal to speed up the clock rate, wherein when the first flagging time point is later than the second flagging time point, the audio tracking circuit generates the slow-down signal to slow down the clock rate.

6. The audio restore circuit of claim 1, wherein the audio generator circuit comprises:

a storage circuit configured to receive and store a decoded audio sampled signal, wherein the audio tracking circuit is further configured to generate a third control signal according to a data amount in the storage circuit, a data water level upper limit of the storage circuit, and a data water level lower limit of the storage circuit, and generate the first control signal according to the third control signal and the second control signal.

7. The audio restore circuit of claim 6, wherein the storage circuit comprises a first-in first-out memory.

8. The audio restore circuit of claim 6, wherein the third control signal comprises an enable signal, wherein when the data amount is between the data water level upper limit and the data water level lower limit, the audio tracking circuit generates the enable signal with a first logic value to maintain the clock rate of the audio clock signal, wherein when the data amount is greater than the data water level upper limit or less than the data water level lower limit, the audio tracking circuit generates the enable signal with a second logic value to adjust the clock rate of the audio clock signal.

9. The audio restore circuit of claim 8, wherein the third control signal further comprises a speed-up signal and a slow-down signal, wherein when the data amount is greater than the data water level upper limit, the audio tracking circuit generates the speed-up signal to speed up the clock rate, wherein when the data amount is less than the data water level lower limit, the audio tracking circuit generates the slow-down signal to slow down the clock rate.

10. The audio restore circuit of claim 6, wherein the second control signal corresponds to a first weighting value, and the third control signal corresponds to a second weighting value.

11. The audio restore circuit of claim 10, wherein the audio tracking circuit comprises:

a control circuit configured to generate the first control signal according to the second control signal, the third control signal, the first weighting value, and the second weighting value, and transmit the first control signal to the clock adjustment circuit to adjust the clock rate of the audio clock signal.

12. The audio restore circuit of claim 11, wherein the clock adjustment circuit comprises:

a phase-locked loop circuit configured to generate a phase-locked loop clock signal; and a clock generator circuit configured to generate the audio clock signal according to the phase-locked loop clock signal.

13. The audio restore circuit of claim 1, wherein the plurality of audio output signals correspond to a plurality of audio channels.

14. An audio restore circuit, comprising:

an audio tracking circuit configured to generate an enable signal and one of a speed-up signal and a slow-down signal according to a data amount of an audio sampled signal, a data water level upper limit, and a data water level lower limit;

a clock adjustment circuit configured to adjust a clock rate of an audio clock signal according to the enable signal and the one of the speed-up signal and the slow-down signal; and an audio generator circuit configured to output a plurality of audio output signals according to the audio sampled signal and the audio clock signal, wherein the audio generator circuit comprises:

a storage circuit configured to receive and store the audio sampled signal.

15. The audio restore circuit of claim 14, wherein the storage circuit comprises a first-in first-out memory.

16. The audio restore circuit of claim 14, wherein when the data amount is between the data water level upper limit and the data water level lower limit, the audio tracking circuit generates the enable signal with a first logic value to maintain the clock rate of the audio clock signal, wherein when the data amount is greater than the data water level upper limit or less than the data water level lower limit, the audio tracking circuit generates the enable signal with a second logic value to adjust the clock rate of the audio clock signal.

17. The audio restore circuit of claim 16, wherein when the data amount is greater than the data water level upper limit, the audio tracking circuit generates the speed-up signal to speed up the clock rate, wherein when the data amount is less than the data water level lower limit, the audio tracking circuit generates the slow-down signal to slow down the clock rate.

18. The audio restore circuit of claim 14, wherein the plurality of audio output signals correspond to a plurality of audio channels.

* * * * *